United States Patent
Pradhan et al.

(10) Patent No.: US 8,722,431 B2
(45) Date of Patent: May 13, 2014

(54) FINFET DEVICE FABRICATION USING THERMAL IMPLANTATION

(75) Inventors: Nilay Anil Pradhan, Waltham, MA (US); Stanislav S. Todorov, Topsfield, MA (US); Kurt Decker-Lucke, South Hamilton, MA (US); Klaus Petry, Merrimac, MA (US); Benjamin Colombeau, Salem, MA (US); Baonian Guo, Andover, MA (US)

(73) Assignee: Varian Semiconductor Equipment Associates, Inc.

( * ) Notice: Subject to any disclaimer, the term of this patent is extended or adjusted under 35 U.S.C. 154(b) by 35 days.

(21) Appl. No.: 13/426,785

(22) Filed: Mar. 22, 2012

(65) Prior Publication Data

US 2013/0252349 A1 Sep. 26, 2013

(51) Int. Cl.
*H01L 21/00* (2006.01)
(52) U.S. Cl.
USPC .............................................. 438/4; 438/470
(58) Field of Classification Search
USPC ...................................................... 438/4, 70
See application file for complete search history.

(56) References Cited

U.S. PATENT DOCUMENTS

| | | | |
|---|---|---|---|
| 4,169,740 A | 10/1979 | Kalbitzer et al. | |
| 4,724,300 A | 2/1988 | Dearnaley | |
| 5,145,794 A | 9/1992 | Kase et al. | |
| 5,196,355 A | 3/1993 | Wittkower | |
| 5,288,650 A | 2/1994 | Sandow | |
| 6,096,607 A | 8/2000 | Ueno | |
| 7,968,459 B2 | 6/2011 | Bedell et al. | |
| 2002/0011612 A1 | 1/2002 | Hieda | |
| 2003/0013260 A1 | 1/2003 | Gossmann et al. | |
| 2005/0208715 A1 | 9/2005 | Seo et al. | |
| 2006/0163581 A1 | 7/2006 | Suvkhanov | |
| 2007/0257315 A1 | 11/2007 | Bedell et al. | |
| 2011/0171795 A1 | 7/2011 | Tsai et al. | |
| 2011/0180847 A1 | 7/2011 | Ikeda et al. | |
| 2012/0018730 A1* | 1/2012 | Kanakasabapathy et al. .. 257/66 |
| 2012/0032732 A1 | 2/2012 | Xiao et al. | |

OTHER PUBLICATIONS

Schiettekatte, et al., "Dose and implantation temperature influence on extended defects nucleation in c-Si", Nuclear Instruments & Methods in Physics Research, Section—B: Beam Interactions with Materials and Atoms, vol. 164-165, Apr. 1, 2000, pp. 425-430.
International Search Report and Written Opinion, with a mailing date of Jun. 21, 2013, for PCT application No. PCT/US2013/033302, Filed Mar. 21, 2013.

* cited by examiner

*Primary Examiner* — Long K Tran

(57) ABSTRACT

A method of forming a FinFET device. The method may include providing a substrate having a single crystalline region, heating the substrate to a substrate temperature effective for dynamically removing implant damage during ion implantation, implanting ions into the substrate while the substrate is maintained at the substrate temperature, and patterning the single crystalline region so as to form a single crystalline fin.

20 Claims, 5 Drawing Sheets

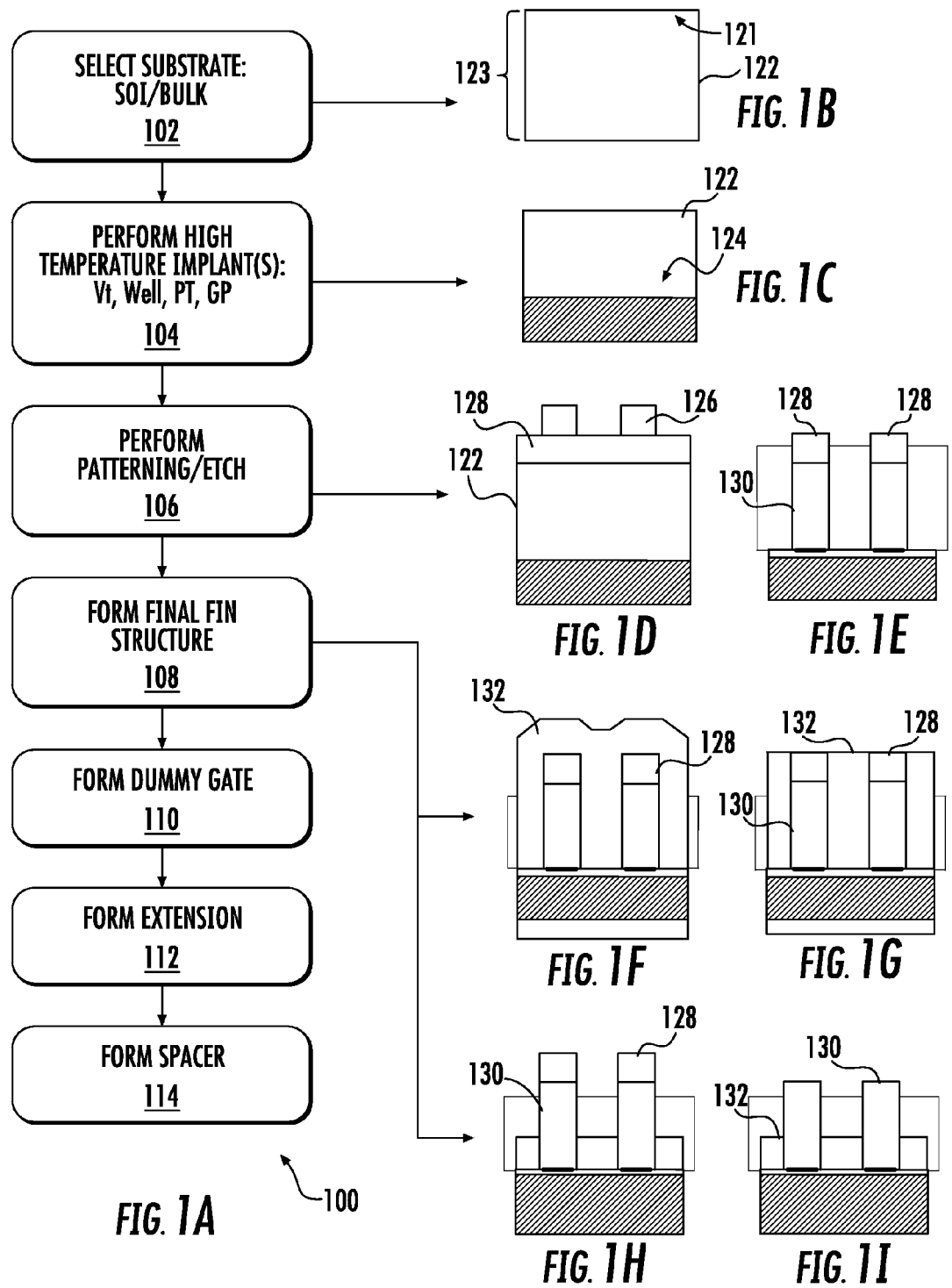

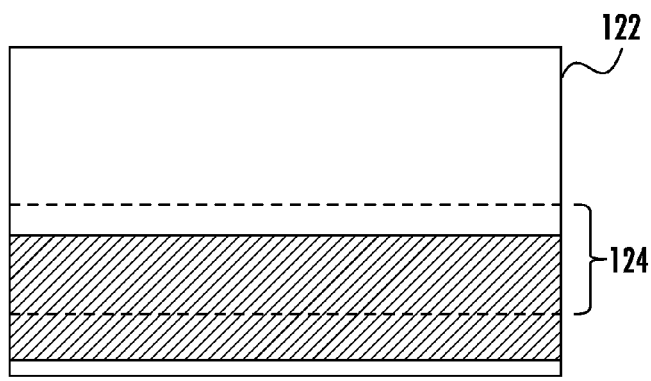 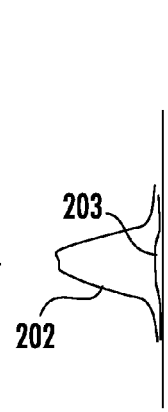
FIG. 2A
CONCENTRATION
FIG. 2B
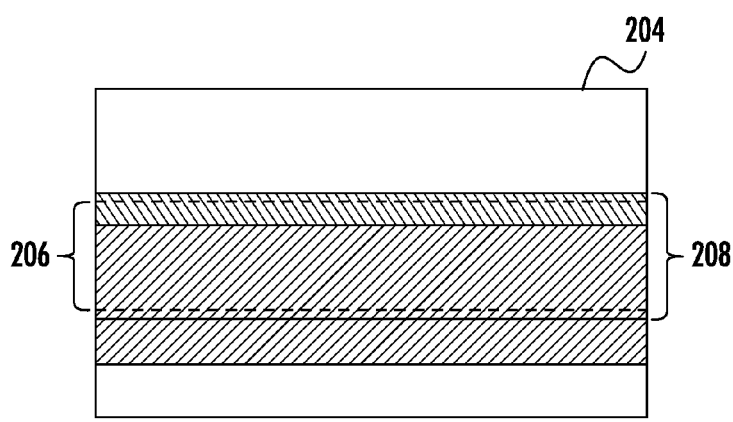 
FIG. 2C
CONCENTRATION
FIG. 2D
*PRIOR ART*

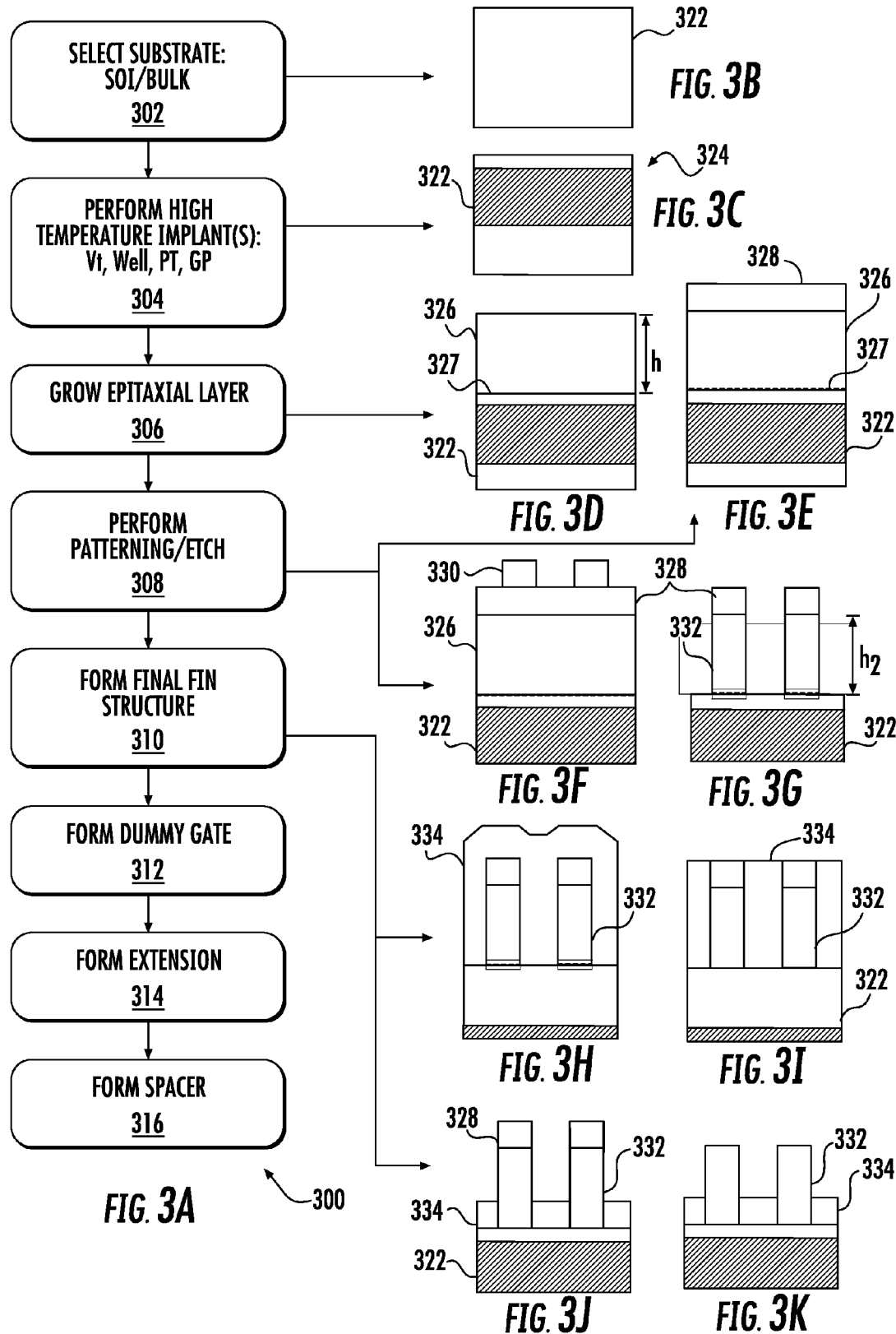

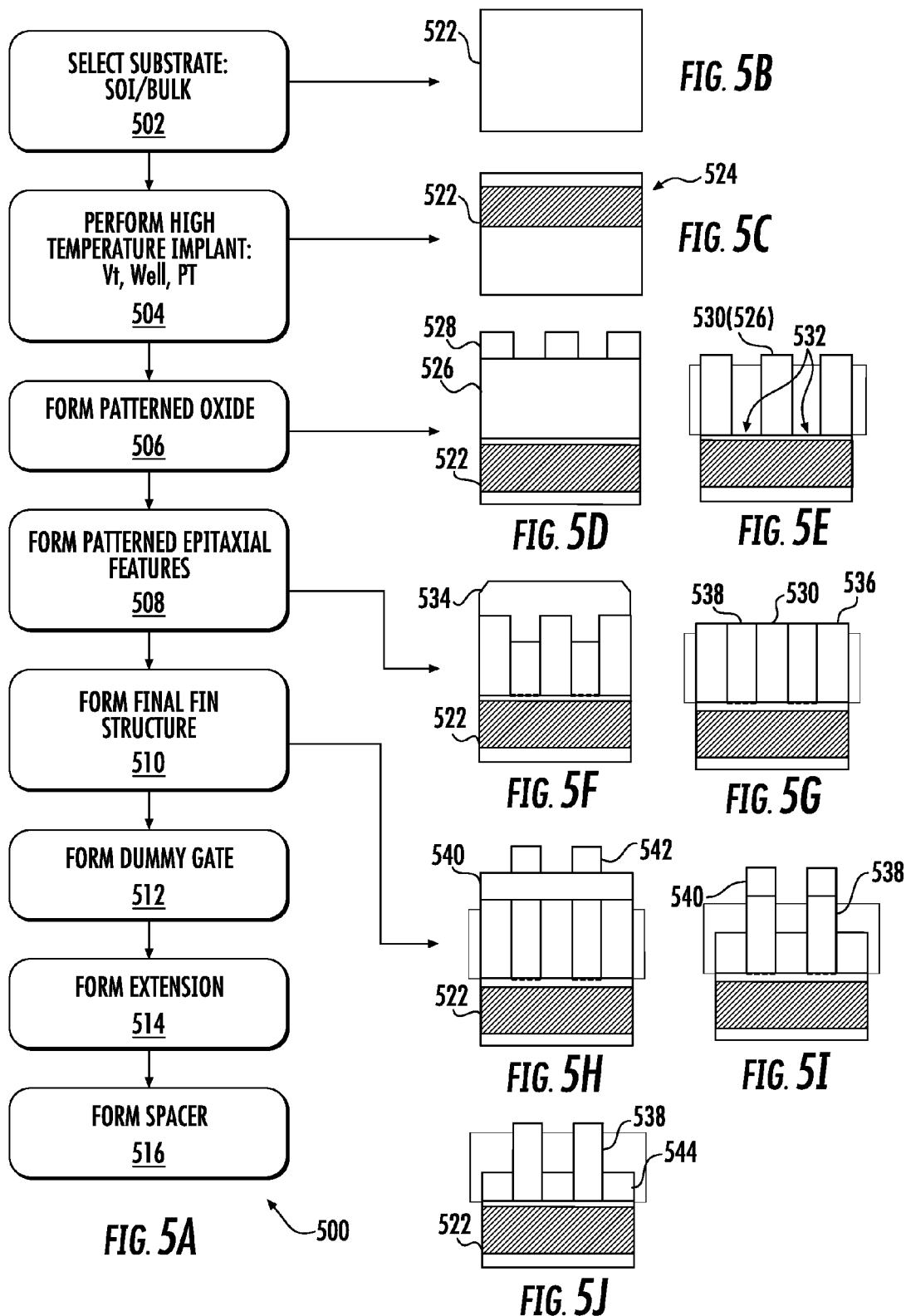

US 8,722,431 B2

FINFET DEVICE FABRICATION USING THERMAL IMPLANTATION

BACKGROUND OF THE INVENTION

1. Field of the Invention

Embodiments of the invention relate to the field of device manufacturing. More particularly, the present invention relates to a method, system and structure for forming a multi-gate transistor.

2. Discussion of Related Art

As semiconductor devices including logic devices based on complementary-metal-oxide-semiconductor (CMOS) architecture continue to scale to smaller dimensions, a transition between conventional planar devices to non-planar devices is taking place in order to preserve the ability to scale performance and device density in keeping with historical trends described by Moore's law. In particular, three-dimensional multigate structures, such as the so-called Fin-type field effect transistor, or FinFET, are under active development to replace planar CMOS devices for coming technology generations.

The term FinFET was coined by University of California, Berkeley researchers to describe a nonplanar, double-gate transistor. A distinguishing characteristic of the FinFET is that the conducting channel is formed by a silicon-based "fin" that extends orthogonally from the surface of a substrate and is wrapped by a gate such that the channel can be gated from opposite sides. The electrical field applied by the gate on opposite sides of the fin extends generally parallel to the surface of the FinFET substrate, as opposed to conventional planar CMOS devices in which the transistor gate produces a field generally orthogonal to the plane of the CMOS substrate. Other, related multigate devices, such as the so-called tri-gate technology, also employ fin-type structures to form conducting channels that are gated upon multiple sides.

In typical FinFET fabrication, before channel structures (that is, fins) are formed, implantation of heavy ion species is performed to control dopant placement and diffusion, such as an isolation/ground plane implantation process. This implantation step is typically performed using species such as As, Sb, P, $BF_2$, Ga or In, among others, and is used to prevent degradation in device resistivity and/or leakage. However, as a consequence of implantation, heavy crystalline damage may be imparted into the substrate, such that the single-crystal silicon structure in the substrate cannot be fully recovered in subsequent thermal processing. Consequently, when fin-type structures are subsequently fabricated, the defect levels in the fins and/or adjacent silicon substrate may be excessive. This results in degraded device characteristics caused by dissipative phenomena arising from residual crystalline damage, including increased resistance and device leakage. In addition, variability in device performance may be increased by the residual defects from the implantation. This may also lead to a decrease in process window for producing devices having acceptable characteristics. In view of the above, it will be appreciated that there is a need for an improved multigate CMOS processes and device structures.

SUMMARY OF THE INVENTION

In one embodiment, a method of forming a FinFET device is provided. The method includes providing a substrate having a single crystalline region, heating the substrate to a substrate temperature effective for dynamically removing implant damage during ion implantation, implanting ions into the substrate while the substrate is maintained at the substrate temperature, and patterning the single crystalline region so as to form a single crystalline fin. In another embodiment, a method of forming a multi-gate transistor comprises heating a substrate comprising an unpatterned single crystalline semiconductor to a substrate temperature above 50° C., performing one or more implants into the substrate while the substrate is maintained at the substrate temperature, and patterning the single crystalline semiconductor so as to form one or more fin structures on the substrate after the one or more implants.

BRIEF DESCRIPTION OF THE DRAWINGS

FIG. 1a presents an exemplary process flow for forming a FinFET device.

FIGS. 1b-1i present cross-sections of the FinFET device structure during select process steps corresponding to blocks depicted in FIG. 1a.

FIG. 2a depicts an enlarged view of the bulk substrate of FIG. 1c.

FIG. 2b illustrates corresponding curves representing the concentration of implanted species and defects as a function of depth in the substrate of FIG. 2a.

FIG. 2c depicts a substrate structure in accordance with the prior art in which implantation takes place on an unheated bulk substrate.

FIG. 2d illustrates corresponding curves representing the concentration of implanted species and defects as a function of depth in the substrate of FIG. 2c.

FIG. 3a presents another exemplary process flow for forming a FinFET device.

FIGS. 3b-3k present cross-sections of the FinFET device structure during select process steps corresponding to blocks depicted in FIG. 3a.

FIG. 5a depicts an alternative process flow consistent with further embodiments for forming a FinFET device.

FIGS. 5b-5j present cross-sections of the FinFET device structure during select process steps corresponding to blocks depicted in FIG. 5a.

DESCRIPTION OF EMBODIMENTS

Figure 4A:
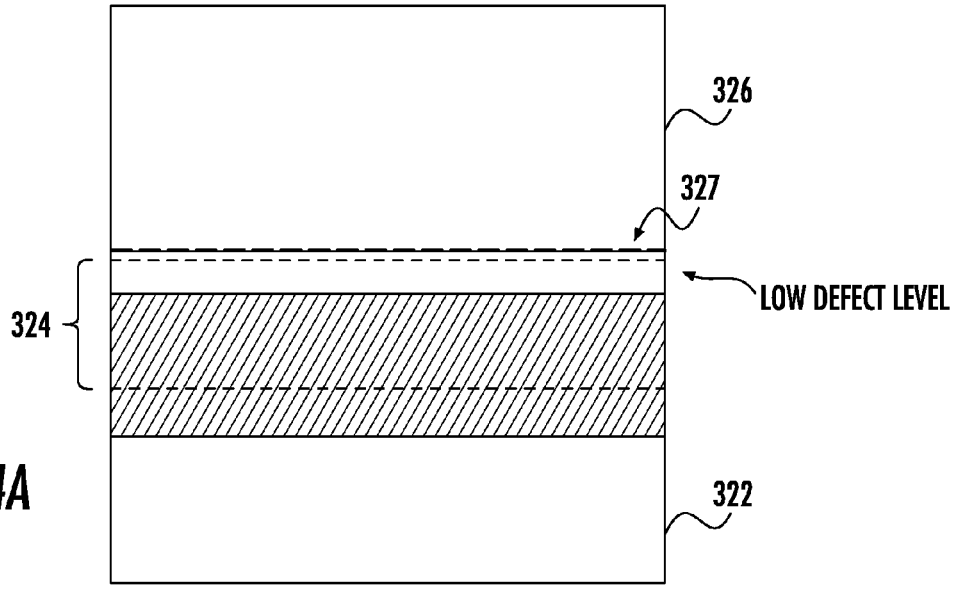
FIG. 4a depicts a detailed view of the bulk substrate shown in FIG. 3d.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

To solve the deficiencies associated with the methods noted above, in the present embodiments improved processes for forming a FinFET are disclosed. As used herein, the term "FinFET" generally refers to a multigate transistor structure that includes a S/D portion formed in a narrow single crystalline structure that extends from a substrate surface, and is surrounded at least on two sides by a transistor gate. A FinFET device consistent with the present embodiments may be a CMOS device, a p-type MOS device (PMOS) or an n-type MOS device (NMOS). The improved FinFET formation processes entail performing one or more implantation steps at an elevated substrate temperature (also termed "thermal implantation" herein) before formation of fin structures of the FinFET. In various embodiments, the substrates may be unpatterned bulk semiconductor substrates or silicon-on-insulator substrates. In various embodiments, during implantation the substrate is heated in-situ to an elevated temperature above room temperature that provides dynamic annealing during implantation of damage caused by the implantation.

Consistent with the present embodiments, the elevated temperature may be a predetermined temperature that is selected based upon empirical observation. For example, the predetermined temperature may be effective in dynamically removing implant damage during an implantation process for a given ion implantation exposure condition or set of exposure conditions when performed at the predetermined temperature. The term "dynamically removing implant damage" as used herein, refers to providing conditions in a substrate, such as an elevated substrate temperature, that removes implant damage that would otherwise remain in the substrate after implantation. Thus, dynamically removing implant damage may involve dynamically annealing substrates during implantation to promote atomic rearrangement to repair defects in the crystalline substrate as they are created, such that residual damage is not found after the implantation or is reduced as compared to implant damage observable for the same implant conditions performed upon unheated substrates. Procedures for determining that an elevated temperature implant process is effective in dynamically removing implant damage may include electron microscopic analysis, electrical measurements, or other measurement methods, which are applied to a substrate after the elevated temperature implantation.

In accordance with the present embodiments, after implantation at an elevated temperature that is effective for dynamically removing implant damage, subsequent thermal processing to anneal out residual damage caused by the implantation may thereby be reduced or eliminated. Therefore, a lower thermal budget may be employed after elevated substrate temperature implantation for pre-fin formation implants (implants performed before fins are fabricated), such as ground plane/isolation implantation. Because of the lower or zero residual crystalline damage after the elevated substrate temperature implantation, lesser or no thermal treatment is required to restore the crystalline structure of the FinFET device being fabricated to a tolerable level required to provide desired performance in the completed FinFET device. This, in turn, results in less dopant diffusion thereby providing more localization of dopants and better device performance. In some embodiments that employ epitaxial growth to form fin structures, the improved crystalline structure provided by the high temperature implantation processes of the present embodiments also provides a better template for epitaxial growth of the transistor fins. The elevated substrate temperature implantation processes of the present embodiments may also lead to improved process margin (process window) for subsequently performed steps during fabrication of a FinFET device, as well as lower device variability in addition to lower device defect levels.

Embodiments of the present disclosure cover FinFET formation on bulk silicon substrates, as well as silicon-on-insulator (SOI) substrates. Also, consistent with further embodiments, silicon substrates may include, in addition to silicon regions, layers of single crystalline semiconductor material such as a silicon:germanium alloy (SiGe), or silicon:carbon alloy, which may be disposed as an epitaxial strained layer adjacent a silicon layer, as is known in the art. The embodiments are not limited in this context.

Consistent with the present embodiments, FIG. 1a presents an exemplary process flow 100 for forming a FinFET device. The various blocks of the process flow illustrated in FIG. 1a may comprise multiple process steps as discussed below. The accompanying FIGS. 1b-1i present cross-sections of the FinFET device structure during select process steps corresponding to blocks depicted in FIG. 1a. It is to be noted that the processes depicted herein span only a portion of fabrication processes used to fabricate a FinFET device, and more particularly span a range of processing before formation of a permanent transistor gate for the FinFET device.

At block 102, a substrate is selected, such as a bulk silicon substrate (depicted as bulk substrate 122 in FIG. 1b), an SOI substrate, a bulk silicon substrate having a strained SiGe layer, etc. In the discussion to follow, a bulk silicon substrate is used for purposes of illustration, although the present embodiments extend to the additional aforementioned substrates. As depicted in the FIGs., the substrate 122 may have a surface 121 and a single crystalline region 123 below the surface 121. It is to be noted that in the case of an SOI substrate, for example, an oxide region (not shown) is present beneath the single crystalline region 123. At block 104, one or more high temperature implantation steps are performed. In various embodiments, the one or more high temperature implantation steps include ion implantation for threshold voltage adjustment ($V_t$ implant), a deep isolation implant (well), a ground plane (GP) implant, which may also be used to isolate devices from one another, and/or an anti-punch-through (PT) implant to limit off-state current ($I_{off}$), among others. In some embodiments, all implants performed at block 104 may be performed at an elevated substrate temperature, while in other embodiments, select implant(s) may be performed at elevated substrate temperature, such as those observed to induce greater damage to the single crystalline structure of the substrate, while one or more other implants are performed on unheated substrates. In particular embodiments, for fabrication of bulk FinFETS, any or all of pre-fin formation implants, including the $V_t$, well, PT, Halo(pocket), and GP implants may be performed using a high temperature implantation process. In other embodiments, the $V_t$, PT, and/or Halo implants may be performed using high temperature implantation to form FinFET devices on SOI substrates. The present embodiments cover implantation of any group In various embodiments, performing a high (also termed "elevated" herein) temperature implantation process comprises heating the substrate to a desired temperature, followed by treatment of the substrate to one or more exposures of ions according to the type of implantation to be performed. The high temperature implantation may be performed, for example, using conventional implantation apparatus, including beam line implanters, or plasma doping (PLAD) apparatus. The embodiments are not limited in this context. In some embodiments, the substrate temperature range for performing high temperature implantation may be 50° C. or greater, and in particular, 50° C.-900° C. Moreover, the present embodiments cover implantation of any of elements belonging to Group III, IV, or V of the Periodic Table, as well as inert gas species, halogens, and group VI elements.

In one example, a GP implantation process for implanting n-type dopant involves implantation of a dose of As at a substrate temperature of 300° C. or greater. The implanted dose may be about $1 \times 10^{14}/cm^2$ to about $1 \times 10^{15}/cm^2$ and the ion energy may be about 2 keV to 200 keV. Over this range of substrate temperature, ion implantation dose, and ion energy, an implanted region of the crystalline (Si, or Si alloy) substrate may be observed by electron microscopy to exhibit no residual crystal damage, such as an amorphous layer or endof-range damage. In other examples, Sb, Ga, P, B, $BF_2$ or In ions may be used to perform high temperature isolation implants. Consistent with the present embodiments, the substrate temperature to which the substrate is heated for high temperature implantation may be adjusted according to the ion species, ion dose, ion energy so that minimal or no residual damage to the single crystalline portions of the substrate is present after the high temperature implantation step.

FIG. 1c depicts a schematic cross-section of a bulk substrate 122 after high temperature implantation. An implanted region 124 (indicated by dashed lines in FIG. 2a) may form beneath the surface of the bulk substrate 122. In various embodiments in which block 104 comprises multiple implant steps, this implanted region may comprise multiple different, separate or overlapping, regions. Moreover, for such multiple implant regions, the implant depth with respect to the surface of the bulk substrate 122 and thickness of each implanted region may vary according to the purpose of the implant and the type of FinFET device being fabricated. The implanted region 124 may include dopants introduced into the bulk substrate 122 by the high temperature implantation process, which dopants may be located in a combination of electrically active and electrically inactive sites within the crystalline lattice of the bulk substrate 122. FIG. 2a depicts an enlarged view of the bulk substrate 122 including the implanted region 124. FIG. 2b illustrates a corresponding curve 202 representing the concentration of implanted species, and a curve 203 representing the concentration of defects, both shown as a function of depth in the bulk substrate 122. As illustrated, the concentration of implanted species (implant profile) forms a peak at a given depth below the surface of the bulk substrate 122. However, in spite of the fact that the bulk substrate 122 may contain a substantial concentration of implanted species, because the bulk substrate 122 is maintained at an elevated temperature during the implantation process, the crystalline lattice of the bulk substrate may be dynamically repaired from any implantation damage during the implantation process, with the result that little or no residual damage to the crystalline lattice of bulk substrate 122 is present, as evident from the curve 203.

In contrast, for reference, FIGS. 2c and 2d depict a scenario in accordance with the prior art in which implantation takes place on an unheated bulk substrate 204. The bulk substrate 204 may be implanted with the same species, ion energy, and ion dose as the bulk substrate 122 of FIG. 2a. As illustrated, the bulk substrate 204 includes an implanted region 206 whose implant profile is represented by the curve 205 of FIG. 2d. In addition, the bulk substrate 204 includes a damaged region 208 that represents schematically portions of the bulk substrate that contain damage such as end-of-range damage, amorphized regions, etc. Because implantation has taken place on an unheated substrate, there is insufficient thermal energy for damage caused during the implantation process to be recovered so that the damaged region 208 persists after the implantation process, as further illustrated by the curve 207, which depicts concentration of defects as a function of depth in the bulk substrate 204. Thus, even after post-implantation annealing, at least a portion of the damaged region may persist. In addition, the curve 205 may represent the implant profile of implanted species after a post-deposition annealing, showing a broader distribution of implant species as compared to curve 202, which may result in deleterious device properties of subsequently fabricated FinFETs, including greater device variability and reduced process window for subsequent process steps.

Turning once more to FIG. 1a, following the block 104, FinFET device fabrication formation according to some embodiments may take place using known processes or variations of known processes. At block 106, the substrate is patterned and etched to form structures to define device fins. This process is illustrated in more detail in FIGS. 1d and 1e. In FIG. 1d, a hard mask layer 128 is provided on the bulk substrate 122, upon which patterned photoresist features 126 are formed. As shown in FIG. 1e, an etch process is subsequently performed that transfers the pattern of photoresist features 126 into the hard mask layer 128. The pattern of the hard mask layer 128 is subsequently transferred by etching into the bulk substrate 122, forming fins 130.

Returning to FIG. 1a, at block 108, the final fin structure is defined. FIGS. 1f-1i illustrate exemplary device structure during different stages of defining the final fin structure. In FIG. 1f, an oxide coating 132 is formed that coats regions between fins 130. The oxide coating 132 is planarized, as shown in FIG. 1g, followed by removal of a portion of the oxide coating 132 between the fins 130 (depicted in FIG. 1h). At FIG. 1i, the hard mask 128 is removed, leaving fins 130 that are isolated from one another by remaining oxide coating 132. Following the formation of the fin structure, at block 110 a dummy gate is formed, and at block 112 source/drain extension regions are created. Subsequently permanent spacers are formed on the device at block 114.

An advantage afforded by the process flow of FIG. 1a is that high temperature annealing to reduce damage to the crystalline substrate created by pre-fin formation ion implantation steps may be eliminated or reduced. It is to be emphasized that in conventional processing for fabricating FinFET devices, where GP, well, PT, Halo and/or $V_t$ implants are performed on unheated substrates, post implantation annealing to repair ion-induced substrate damage may be less effective in reducing defects in the substrate than in-situ annealing during implantation that is provided by the high temperature implantation processes. Moreover, post implantation annealing of substrates implanted without heating may require higher annealing temperatures or a greater overall thermal budget than that employed in the high temperature implantation processes of the present embodiments.

In further embodiments, pre-fin formation implantation may be performed at elevated temperatures for FinFETS fabricated using epitaxial growth to form fin portions of a FinFET device. Consistent with the present embodiments, FIG. 3a presents another exemplary process flow 300 for forming a FinFET device. The various blocks of the process flow illustrated in FIG. 3a may comprise multiple process steps as discussed below. The accompanying FIGS. 3b-3k present cross-sections of the FinFET device structure during select process steps corresponding to blocks depicted in FIG. 3a. At block 302, a substrate is selected, such as a bulk silicon substrate (depicted as bulk substrate 322 in FIG. 3b), an SOI substrate, a bulk silicon substrate having a strained SiGe layer, etc.

At block 304, one or more high temperature implantation steps are performed. In various embodiments, the one or more high temperature implantation steps include ion implantation for threshold voltage adjustment ($V_t$ implant), a deep isolation implant (well), a ground plane (GP) implant which may also be used to isolate devices from one another, and/or an anti-punchthrough (PT) or Halo implant to limit off-state current ($I_{off}$), among others. In some embodiments, all implants performed at block 304 may be performed at an elevated substrate temperature, while in other embodiments, select implant(s) may be performed at elevated substrate temperature, such as those observed to induce greater damage to the single crystalline structure of the substrate, while one or more other implants are performed on unheated substrates. In particular embodiments, for fabrication of bulk FinFETS, any or all of pre-fin formation implants, including the $V_t$, well, PT, Halo and GP implants may be performed using a high temperature implantation process. In other embodiments, the V, Halo, and/or PT implants may be performed using high temperature implantation to form FinFET devices on SOI substrates. As with the process flow 100, in various embodiments, the substrate temperature range for performing high temperature implantation may be 50° C. or greater, and in particular, 50° C.-900° C.

In one example, a GP implantation process for implanting n-type dopant involves implantation of a dose of As at a substrate temperature of 300° C. or greater. Because at least a portion of a fin is to be formed within a subsequently deposited epitaxial layer, the ion energy used for various implants at block 304 may be reduced with respect to that employed in the process flow illustrated in FIG. 1a. This is shown schematically in FIG. 3c, which depicts formation of an implanted region 324 that lies closer to the top surface of bulk substrate 322 as compared to implanted region 124 shown in FIG. 1c. Consistent with the present embodiments, the substrate temperature to which the substrate is heated for high temperature implantation at block 304 may be adjusted according to the ion species, ion dose, ion energy so that minimal or no residual damage to the single crystalline portions of the substrate is present after the high temperature implantation step. Because the ion energy for various high temperature implants that may be performed at block 304 may be lower than that employed according to the process flow of FIG. 1a, the substrate temperature of bulk substrate 322 may be adjusted to a different value than that employed for a comparable high temperature implantation process or set processes of block 104. For example, at block 304, a GP implant may be performed at reduced ion energy as compared to block 104, which may induce less instantaneous substrate damage and thereby require a lower substrate temperature to effectively dynamically anneal out the substrate damage during high temperature implantation.

Returning to FIG. 3a, at block 306, an epitaxial layer is deposited. In various embodiments, this epitaxial layer may include silicon, SiGe, another silicon-containing alloy, or Ge, among other materials. The embodiments are not limited in this context. FIG. 3d illustrates deposition of an epitaxial layer 326 upon the bulk substrate 322. An interface 327 between the epitaxial layer 326 and bulk substrate 322 is illustrated as a dashed line. In some cases, after deposition of the epitaxial layer 326, no physical interface between the bulk substrate 322 and epitaxial layer 326 may be readily discernable. Accordingly, the interface 327 may also represent a reference level to indicate the original top surface of the bulk substrate 322 before epitaxial growth. The thickness h of the epitaxial layer 326 may be chosen based upon the eventual height of fins to be formed in the FinFET device being fabricated. In alternative embodiments, the fin height may be equivalent to the thickness h or may be greater or less than the thickness h, depending upon device requirements.

Because the bulk substrate 322 is maintained at elevated substrate temperature during one or more implants during the block 304, the region of the bulk substrate near the interface 327 may be sufficiently defect free to induce growth of the epitaxial layer 326 in a manner that produces a low defect layer suitable for subsequent FinFET device fabrication. This is illustrated in FIG. 4a, which depicts a detailed view of the bulk substrate 322 after growth of the epitaxial layer 326. As illustrated, the implanted region 324 is formed in an upper region of the bulk substrate 322 below the interface 327. Immediately below the interface 327, the bulk substrate 322 may exhibit a low defect level after high temperature implantation, as illustrated. Because of this low defect level in the upper region of the original bulk substrate 322, when epitaxial growth takes place on the bulk substrate 322, a high quality epitaxial layer 326 is formed.

Figure 4B:
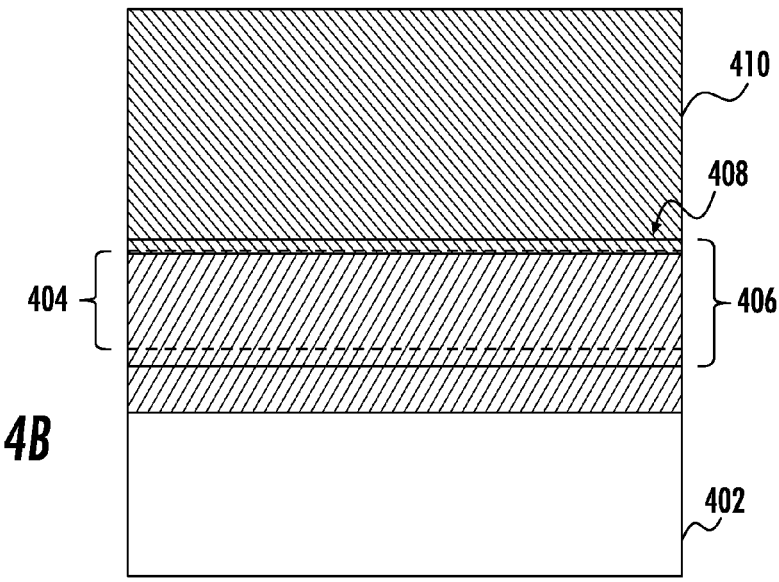
FIG. 4b shows a schematic depiction of a stage of FinFET formation after epitaxial growth consistent with the prior art.

In contrast, FIG. 4b shows a schematic depiction of a stage of FinFET formation after epitaxial growth consistent with the prior art. In this case, room temperature implantation (that is, implantation upon unheated substrates) is performed in a substrate 402, resulting in an implanted region 404. However, because the substrate 402 is unheated during implantation, a damaged region 406 remains in the substrate 402, even after post-implantation annealing before epitaxial growth. This damaged region 406 may extend to the top surface of the substrate 402, indicated by interface 408. Subsequently, when epitaxial growth takes place on substrate 402, the damaged region 406 may induce formation of a defective epitaxial layer 410 due to the imperfect crystallinity of the surface provided at interface 408.

Turning once more to FIG. 3a, following the block 306, at block 308, the substrate is patterned and etched to form structures to define device fins. This process is illustrated in more detail in FIGS. 3e-3g. In FIG. 3e, a hard mask layer 328 is provided on the bulk substrate 322, upon which patterned photoresist features 330 are formed, as shown in FIG. 3f. As shown in FIG. 3g, an etch process is subsequently performed that transfers the pattern of photoresist features 330 into the hard mask layer 328. The pattern of the hard mask layer 328 is subsequently transferred into the bulk substrate 322, forming fins 332. As noted previously, the fin height $h_2$ may be arranged the same as the thickness h of the epitaxial layer, or may be different than the thickness h.

Returning to FIG. 3a, at block 310, the final fin structure is defined. FIGS. 3h-3k illustrate the exemplary device structure during different stages of defining the final fin structure. In FIG. 3h, an oxide coating 334 is formed that coats regions between fins 332. The oxide coating 334 is planarized, as shown in FIG. 3i, followed by removal of a portion of the oxide coating 334 between the fins 332 (depicted in FIG. 3j). At FIG. 3k, the hard mask layer 328 is removed, leaving fins 332 that are isolated from one another by remaining oxide coating 334. Following the formation of the fin structure, at block 312 a dummy gate is formed, and at block 314 source/drain extension regions are created. Subsequently permanent spacers are formed on the device at block 316.

FIG. 5a depicts an alternative process flow 500 consistent with further embodiments for forming a FinFET device using high temperature implantation for pre-fin formation implant processes. In the process flow 500, epitaxial growth is used to form fin structures. However, in this embodiment, the epitaxial growth takes place on a substrate that is pre-patterned before epitaxial growth with insulating structures, which serve to define the fins. The accompanying FIGS. 5b-5j present cross-sections of the FinFET device structure during select process steps corresponding to blocks depicted in FIG. 5a. At block 502, a substrate is selected, such as a bulk silicon substrate (depicted as bulk substrate 522 in FIG. 1b), an SOI substrate, a bulk silicon substrate having a strained SiGe layer, etc.

At block 504, one or more high temperature implantation steps are performed, such as those described above with respect to FIG. 3a. Because at least a portion of a fin is to be formed within a subsequently deposited epitaxial layer, the ion energy used for various implants at block 504 may be reduced with respect to that employed in the process flow illustrated in FIG. 1a. This is shown schematically in FIG. 5c, which depicts formation of an implanted region 524 that lies closer to the top surface of bulk substrate 522 as compared to implanted region 124 shown in FIG. 1c. Consistent with the present embodiments, the substrate temperature to which the substrate is heated for high temperature implantation at block 504 may be adjusted according to the ion species, ion dose, ion energy so that minimal or no residual damage to the single crystalline portions of the substrate is present after the high temperature implantation step. Because the ion energy for various high temperature implants that may be performed at block 504 may be lower than that employed according to the process flow of FIG. 1a, the substrate temperature of bulk substrate 522 may be different than that employed for the high temperature implantation process of block 104. For example, at block 504, a GP implant may be performed at reduced ion energy as compared to block 104, which may induce less instantaneous substrate damage and thereby require a lower substrate temperature to effectively anneal out the substrate damage during high temperature implantation.

At block 506, patterned oxide is formed on the substrate. The patterned oxide is created to serve as a template for receiving a subsequently deposited silicon layer in order to define silicon fins. As depicted in FIGS. 5d and 5e, the patterned oxide may be formed by a combination of oxide deposition, lithographic patterning and etching. In FIG. 5d a structure is illustrated in which a blanket oxide layer 526 is disposed upon the bulk substrate 522. Patterned resist features 528 are disposed upon the outer surface of the blanket oxide layer 526. FIG. 5e depicts a subsequent stage of processing in which the underlying blanket oxide layer 526 is etched in regions between the patterned resist features 528, followed by the removal of any remaining resist. A result of the etching is the formation of patterned oxide features 530 formed from the original blanket oxide layer 526. The blanket oxide layer 526 is completely etched in exposed regions so that the surface of bulk substrate 522 is exposed in a series of regions 532.

Returning to FIG. 5a, at block 508, patterned epitaxial features are formed. FIGS. 5f and 5g present exemplary illustrations of the device structure at different stages during the formation of patterned epitaxial features. In FIG. 5f, an epitaxial material 534 is deposited upon the device such that material is grown on regions 532 of the bulk substrate 522. During the epitaxial growth process, the epitaxial material is deposited so as to completely fill regions between patterned oxide features 530. The epitaxial material 534 may extend above the patterned oxide feature 530 and may coalesce to cover the tops of the patterned oxide features 530, as illustrated. In FIG. 5g, an etch/polish step is performed to form a planarized surface 536 so that tops of patterned oxide features 530 are exposed, resulting in the formation of isolated fins 538.

As in the embodiments of FIG. 3a, because the bulk substrate 522 is maintained at elevated substrate temperature during one or more implants during the block 504, the region of the bulk substrate 522 near the exposed regions 532 may be sufficiently defect free to induce growth of the epitaxial material 534 in a manner that produces high quality fins 538 having a low defect density.

At block 510, a final fin structure is formed, as detailed in the FIGS. 5h-5j. In FIG. 5h, a hard mask layer 540 is deposited on the planarized surface 536. Patterned resist features 542 are subsequently formed upon the hard mask layer 540. The patterned resist features 542 are aligned to overlay respective fins 538. At FIG. 5i, the exposed region of the hard mask layer 540 and underlying patterned oxide features 530 are etched. At FIG. 5k, the remaining portions of hard mask layer 540 are removed, leaving fins 538 that are isolated from one another by remaining oxide features 544. Following the formation of the fin structure, at block 512 a dummy gate is formed, and at block 514 source drain extension regions are created. Subsequently permanent spacers are formed on the device at block 516.

The methods described herein may be automated by, for example, tangibly embodying a program of instructions upon a computer readable storage media capable of being read by machine capable of executing the instructions. A general purpose computer is one example of such a machine. A non-limiting exemplary list of appropriate storage media well known in the art includes such devices as a readable or writeable CD, flash memory chips (e.g., thumb drives), various magnetic storage media, and the like.

The present invention is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the subject matter of the present disclosure should be construed in view of the full breadth and spirit of the present disclosure as described herein.

What is claimed is:

1. A method of forming a Fin-type field effect transistor (FinFET) device, comprising:
   providing a substrate having a single crystalline region;
   heating the substrate to a substrate temperature effective for dynamically removing implant damage during ion implantation and reducing dopant diffusion;
   implanting ions into the substrate while the substrate is maintained at the substrate temperature; and
   patterning the single crystalline region to form a single crystalline fin after implanting the ions into the substrate.

2. The method of claim 1, the substrate comprising one of: a bulk silicon substrate and a silicon-on-insulator substrate.

3. The method of claim 2, the substrate comprising a strained silicon germanium epitaxial layer.

4. The method of claim 1, the ions comprising antimony or indium ions.

5. The method of claim 1, the substrate temperature comprising a temperature in the range from 50° C. to 900° C.

6. The method of claim 1, the ions comprising an ion energy of 2 keV to 200 keV.

7. The method of claim 1, comprising performing multiple implants, wherein at least one implant comprises implanting ions into the substrate while substrate temperature is maintained at a temperature that is effective in dynamically removing implant damage caused by the at least one implant.

8. The method of claim 1, further comprising performing, before the patterning the single crystalline region, one or more implants that each comprises:
   heating the substrate to a respective substrate temperature effective for dynamically removing implant damage during ion implantation corresponding to the respective implant; and
   implanting the substrate while the substrate is maintained at the respective substrate temperature.

9. The method of claim 1, further comprising:
providing patterned mask features on the substrate after the implanting the ions; and
etching exposed portions of the substrate so as to form the single crystalline fin.

10. The method of claim 1, further comprising:
depositing an epitaxial semiconductor layer on the substrate after the implanting the ions;
providing patterned mask features on the substrate after the depositing the expitaxial semiconductor layer; and
etching exposed portions of the epitaxial semiconductor layer so as to form the single crystalline fin.

11. The method of claim 1, further comprising:
depositing an oxide layer on the substrate after the implanting the ions;
forming patterned features in the oxide layer that define a set of exposed substrate regions; and
epitaxially growing a semiconductor layer upon the exposed substrate regions so as to form a set of single crystalline fins.

12. The method of claim 1, wherein the ions comprise at least one element, and an element of the at least one element is a group III element, group IV element, group V element, group VI element, halogen, or inert gas specie.

13. A method of forming a multi-gate transistor device, comprising:
heating a substrate comprising an unpatterned single crystalline semiconductor to a substrate temperature above 50° C. for dynamically removing implant damage during implants and reducing dopant diffusion;
performing one or more implants into the substrate while the substrate is maintained at the substrate temperature; and
patterning the unpatterned single crystalline semiconductor so as to form one or more fin structures on the substrate after the one or more implants.

14. The method of claim 13, the one or more implants comprising at least one of: ion implantation for threshold voltage adjustment (Vt implant), a deep isolation implant (well implant), a ground plane (GP) implant, a halo implant, and an anti-punchthrough (PT) implant.

15. The method of claim 13, wherein at least one implant comprises implanting ions into the substrate while substrate temperature is maintained at a temperature that is effective in dynamically removing implant damage caused by the respective at least one implant.

16. The method of claim 13, the substrate comprising one of: a bulk silicon substrate and a silicon-on-insulator substrate.

17. The method of claim 16, the substrate comprising a strained silicon alloy portion.

18. The method of claim 13, further comprising:
providing patterned mask features on the substrate after the one or more implants; and
etching exposed portions of the substrate so as to form the single crystalline fin.

19. The method of claim 13, further comprising:
depositing an epitaxial semiconductor layer on the substrate after the one or more implants;
providing patterned mask features on the substrate after the depositing the expitaxial semiconductor layer; and
etching exposed portions of the epitaxial semiconductor layer so as to form the single crystalline fin.

20. The method of claim 13, further comprising:
depositing an oxide layer on the substrate after the one or more implants;
forming patterned features in the oxide layer that define a set of exposed substrate regions; and
epitaxially growing a semiconductor layer upon the exposed substrate regions so as to form a set of single crystalline fins.

\* \* \* \* \*